(12) United States Patent
Suzuki

(10) Patent No.: US 6,745,393 B2
(45) Date of Patent: Jun. 1, 2004

(54) BROADCAST RECEIVING APPARATUS

(75) Inventor: Takaaki Suzuki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/270,504

(22) Filed: Oct. 16, 2002

(65) Prior Publication Data
US 2003/0074675 A1 Apr. 17, 2003

(30) Foreign Application Priority Data
Oct. 17, 2001 (JP) ......................... 2001-319006

(51) Int. Cl.$^7$ ................................ H04N 7/16
(52) U.S. Cl. .................. 725/151; 725/68; 725/142
(58) Field of Search .................. 725/151, 139, 725/131, 68, 38, 100, 89; 709/103; 348/725, 731, 732, 734; 455/150.1, 151.1, 154.1, 158.1, 179.1, 186.1, 3.02

(56) References Cited

U.S. PATENT DOCUMENTS

| 4,897,727 A | 1/1990 | Richards |
| 6,055,560 A | * 4/2000 | Mills et al. .................. 709/200 |

FOREIGN PATENT DOCUMENTS

| GB | 2 218 234 | 11/1989 |
| JP | 10-178621 | 6/1998 |
| JP | 11-275476 | 10/1999 |
| JP | 2000-236528 | 8/2000 |
| JP | 2001-128077 | 5/2001 |

* cited by examiner

Primary Examiner—Chris Grant
Assistant Examiner—Chris Lambrecht
(74) Attorney, Agent, or Firm—Wenderoth, Lind & Ponack, L.L.P.

(57) ABSTRACT

There is provided a broadcast receiving apparatus which is capable of performing a tuning process in a short period of time even in the case where a large number of tuning requests are issued. A tuning request reception section 204 receives an issue tuning request. A tuning request storage section 205 stores the tuning request received by the tuning request reception section 204. A tuning process section including a tuning request acquisition section 206 and a tuning execution section 207 performs a tuning process for the broadcast signal corresponding to the tuning request, and if a next tuning request is issued during a tuning process, performs a next tuning process in accordance with one of the tuning requests stored in the tuning request storage section 205. A tuning request which is stored in the tuning request storage section 205 during a tuning process is erased by a tuning request erasure section 208 after the tuning process.

17 Claims, 8 Drawing Sheets

BROADCAST RECEIVING APPARATUS

BACKGROUND OF THE INVENTION

1. Field of the Invention

The present invention relates to a broadcast receiving apparatus, and more particularly to a broadcast receiving apparatus which performs a tuning process in accordance with a tuning request issued by a software application or the like.

2. Description of the Background Art

Figure 12:
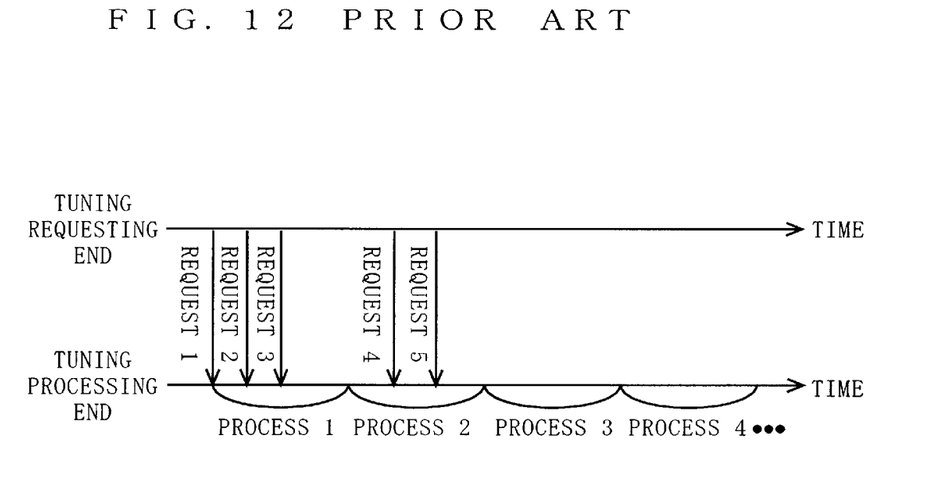
FIG. 12 is a diagram illustrating a timing scheme with which tuning requests are received and tuning processes are performed in a conventional broadcast receiving apparatus.

FIG. 12 is a diagram illustrating a timing scheme with which tuning requests are received and tuning processes are performed in a conventional broadcast receiving apparatus. In FIG. 12, a "tuning requesting end", which is an input means such as a remote control operated by a user, issues tuning requests. When tuning requests 1 to 3 are consecutively made as shown in FIG. 12, the broadcast receiving apparatus sequentially performs tuning processes corresponding to the respective tuning requests. Furthermore, if further tuning requests (Request 4 and Request 5 shown in FIG. 12) are made during a tuning process, the broadcast receiving apparatus performs tuning processes corresponding to the further tuning requests after the tuning processes for the tuning requests which have already been received are all completed. Thus, in this conventional broadcast receiving apparatus, all issued tuning requests are stored, and tuning processes are performed for all such tuning requests. Therefore, it can take a long time before all of the tuning processes are completed in the case where a large number of tuning requests are consecutively issued.

In view of the above problem, some conventional broadcast receiving apparatuses are arranged so as to realize more efficient tuning processes corresponding to consecutive tuning requests. One such instance employs a special remote control to better handle consecutive tuning requests being issued by a user. This remote control observes a certain waiting period after the user operates the remote control to issue a tuning request. If no further tuning requests are issued during this period, the remote control transmits the tuning request to the broadcast receiving apparatus. As a result, the number of tuning requests which are transmitted to the broadcast receiving apparatus can be decreased in the case where the user uses this remote control to issue consecutive tuning requests. Thus, the amount of time required for the tuning process when a user issues consecutive tuning requests can be reduced.

Another instance of handling consecutive tuning requests is a method where any tuning requests that are issued during a tuning process are not received, or ignored. This method will be described with respect to the exemplary case illustrated in FIG. 12. No tuning processes are performed for Tuning Requests 2 and 3, which are issued during Tuning Process 1. A tuning process is performed for Tuning Request 4, which is issued after Tuning Process 1 is completed. No tuning process is performed for Tuning Request 5, which is issued during the processing of Tuning Process 4. This method also reduces the amount of time required for the tuning processes when a user consecutively issues tuning requests.

In recent years, environments for allowing software applications (hereinafter simply referred to as "applications") to operate on broadcast receiving apparatuses are coming into existence. As used herein, an "application" is defined as a program which is executed to attain various purposes on a broadcast receiving apparatus. An application may issue a tuning request for its own purpose. An example of such an environment is a broadcast receiving apparatus which conforms to the DVB-MHP (Digital Video Broadcasting Multimedia Home Platform) standard. An application which can be run on a broadcast receiving apparatus conforming to the DVB-MHP standard can issue a tuning request by calling a tuning API (Application Program Interface) which is provided on the broadcast receiving apparatus. Under the DVB-MHP standard, calling of a tuning API is an asynchronous process, defined so as to "return to execution of the application once the issuance of a tuning request is completed". This implies that, after an application has called the tuning API to issue a tuning request, it is capable of performing a next operation without waiting for a tuning process to be completed. In other words, an application which runs on a broadcast receiving apparatus conforming to the DVB-MHP standard can issue a large number of tuning requests during a tuning process. Thus, it is possible for a large number of tuning requests to be issued in a short period of time.

In the above-described environment, the problem associated with a long time being required for tuning processes becomes even more pronounced. The reason is that the number of tuning requests which an application can issue in a given period of time is far greater than the number of tuning requests which a human user can issue by using a remote control. Therefore, according to the above-described method where all tuning requests are met with corresponding tuning processes being performed, a huge amount of time may be required to complete all tuning processes in the case where a large number of applications (i.e., more than those which can be issued by a human user) are issued from an application during a tuning process.

Moreover, since a long period of time will be spent before all tuning processes can be completed, it is possible for even more tuning requests to be issued while the currently issued tuning requests are being processed. As a result, the large number of tuning requests being issued in a short period time may eventually result in a growing heap of more and more tuning requests to be processed. Under the conventional method where all tuning processes must be performed, it is necessary to store the tuning requests issued during a tuning process until corresponding tuning processes are performed. Therefore, in the case where an application issues a large number of tuning requests in a short period of time, the conventional method will require the presence of a memory, of an indefinite size, for storing the tuning requests. If such a memory is not provided, it is possible for the processes not to be properly performed due to insufficient memory resources.

In the above-described method where any tuning requests issued during a tuning process are not accepted, no tuning processes are performed for tuning requests which are issued during a tuning process. Therefore, according to this method, even necessary tuning processes may not be performed. For example, a plurality of tuning requests may be issued from a plurality of applications during a tuning process. In such a case, none of the necessary tuning processes for the tuning requests issued from the plurality of applications is performed according to the above-described method where any tuning requests issued during a tuning process are not accepted. Thus, this method is considered to be insufficient as a measure for reducing the amount of time required for tuning processes.

On the other hand, the method described earlier is only directed to human operations. This technique aims to reduce the number of tuning requests emanating from a remote control at the tuning requesting end. Therefore, while this technique is applicable to the case where a human user makes consecutive tuning requests by operating a remote control or a front panel of a television, it cannot be used for the case where an application(s) makes consecutive tuning requests.

SUMMARY OF THE INVENTION

Therefore, an object of the present invention is to provide a broadcast receiving apparatus which can perform a tuning process in a short period of time even in the case where a large number of tuning requests are issued.

The present invention has the following features to attain the above object.

A first aspect of the present invention is directed to a broadcast receiving apparatus for receiving a broadcast signal, comprising: a tuning request reception section for receiving an issued tuning request; a tuning request storage section for storing the tuning request received by the tuning request reception section; a tuning process section for performing a tuning process for the broadcast signal corresponding to the tuning request, wherein, if at least one tuning request is issued during the tuning process, the tuning process section performs a next tuning process corresponding to one of the at least one tuning request stored in the tuning request storage section during the tuning process; and a tuning request erasure section for erasing, at a predetermined point in time, the at least one tuning request stored in the tuning request storage section during the tuning process.

According to the first aspect, one of a number of tuning requests which are made during a single tuning process is processed. In other words, the broadcast receiving apparatus does not perform a tuning process for every one of a plurality of tuning requests issued during a tuning process. Thus, even if a large number of tuning requests are issued, it is possible to perform the tuning process in a short period of time. Moreover, since the tuning requests stored in the tuning request storage section are sequentially erased by the tuning request erasure section, it is not necessary to prepare a memory of an indefinite size. Furthermore, according to the first aspect, since a tuning process is performed for the one tuning request among all that have been issued, the necessary tuning processes are prevented from being ignored.

In a second aspect based on the first aspect, the tuning request erasure section erases the at least one tuning request stored in the tuning request storage section at the beginning of the tuning process.

According to the second aspect, at least one of the tuning requests already issued is erased every time a tuning process is begun. As a result, the broadcast receiving apparatus only needs to store a number of tuning requests which can possibly be issued during a period of time required for a single tuning process. Therefore, according to the second aspect, the amount of memory required for storing tuning requests can be reduced.

In a third aspect based on the first aspect, the tuning request storage section is capable of storing a predetermined number of tuning requests, and if the predetermined number is exceeded as a result of a new tuning request issued during the tuning process, the new tuning request replaces one of the tuning requests already stored.

According to the third aspect, it is possible to reduce the amount of memory provided for storing tuning requests down to the predetermined number.

In a fourth aspect based on the first aspect, if the tuning process fails, the tuning process section performs a further tuning process corresponding to one of the tuning requests stored in the tuning request storage section during a previous tuning process, and the tuning request erasure section erases the at least one tuning request stored in the tuning request storage section during the previous tuning process after the further tuning is completed.

According to the fourth aspect, even if a tuning process fails, a tuning process is performed again. As used herein, "completion" of a tuning process only refers to a successful completion of a tuning process, and not an unsuccessful completion of a tuning process.

In a fifth aspect based on the fourth aspect, the tuning request storage section is capable of storing a predetermined number of tuning requests, and if the predetermined number is exceeded as a result of a new tuning request issued during the tuning process, the new tuning request replaces one of the tuning requests already stored.

According to the fifth aspect, as in the fourth aspect, even if a tuning process fails, it is possible to again perform a tuning process. In this case, a tuning request stored in the tuning request storage section is erased by the tuning request erasure section only after completion of the tuning process. Although the fifth aspect therefore requires a greater amount of memory than the second aspect, the fifth aspect makes it possible to reduce the amount of memory provided for storing tuning requests down to the predetermined number.

In a sixth aspect based on the first aspect, if at least one tuning request is issued during the tuning process, the tuning process section performs a next tuning process corresponding to a most recent tuning request among the at least one tuning request stored in the tuning request storage section.

According to the sixth aspect, a tuning process is performed based on the most recent tuning request, i.e., the last-issued tuning request.

In a seventh aspect based on the sixth aspect, the tuning request storage section is capable of storing one tuning request, and if a new tuning request is received by the tuning request reception section, the new tuning request replaces one of the tuning requests already stored.

According to the seventh aspect, only the most recent tuning request is stored in the tuning request storage section. Therefore, the amount of memory provided for storing tuning requests can be minimized.

In an eighth aspect based on the first aspect, the tuning requests are issued by a software application.

A ninth aspect of the present invention is directed to a method for use in a broadcast receiving apparatus for receiving a broadcast signal, comprising: a tuning request reception step of receiving an issued tuning request; a tuning request storage step of storing the tuning request received in the tuning request reception step; a tuning process step of performing a tuning process for the broadcast signal corresponding to the tuning request, wherein, if at least one tuning request is issued during the tuning process, a next tuning process is performed corresponding to one of the at least one tuning request stored in the tuning request storage step during the tuning process; and a tuning request erasure step of erasing, at a predetermined point in time, the at least one tuning request stored during the tuning process.

In a tenth aspect based on the ninth aspect, at the beginning of the tuning process, the tuning request erasure step erases the at least one tuning request stored in a previous tuning process.

In an eleventh aspect based on the ninth aspect, if a predetermined number is exceeded as a result of a new tuning request issued during the tuning process, the new tuning request replaces one of the tuning requests already stored.

In a twelfth aspect based on the ninth aspect, if the tuning process fails, the tuning process step performs a further tuning process corresponding to one of the tuning requests stored during a previous tuning process, and the tuning request erasure step erases the at least one tuning request stored during the previous tuning process after the further tuning is completed.

In a thirteenth aspect based on the twelfth aspect, if a predetermined number is exceeded as a result of a new tuning request issued during the tuning process, the new tuning request replaces one of the tuning requests already stored.

In a fourteenth aspect based on the ninth aspect, if at least one tuning request is issued during the tuning process, the tuning process step performs a next tuning process corresponding to a most recent tuning request among the at least one tuning request stored in the tuning request storage step.

In a fifteenth aspect based on the fourteenth aspect, the tuning request storage step each stores one tuning request, and if a new tuning request is received by the tuning request reception step, the new tuning request replaces one of the tuning requests already stored.

In a sixteenth aspect based on the ninth aspect, the tuning requests are issued by a software application.

A seventeenth aspect of the present invention is directed to a program for causing a computer comprised in a broadcast receiving apparatus for receiving a broadcast signal to execute: a tuning request reception step of receiving an issued tuning request; a tuning request storage step of storing the tuning request received in the tuning request reception step; a tuning process step of performing a tuning process for the broadcast signal corresponding to the tuning request, wherein, if at least one tuning request is issued during the tuning process, a next tuning process is performed corresponding to one of the at least one tuning request stored in the tuning request storage step during the tuning process; and a tuning request erasure step of erasing, at a predetermined point in time, the at least one tuning request stored during the tuning process.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
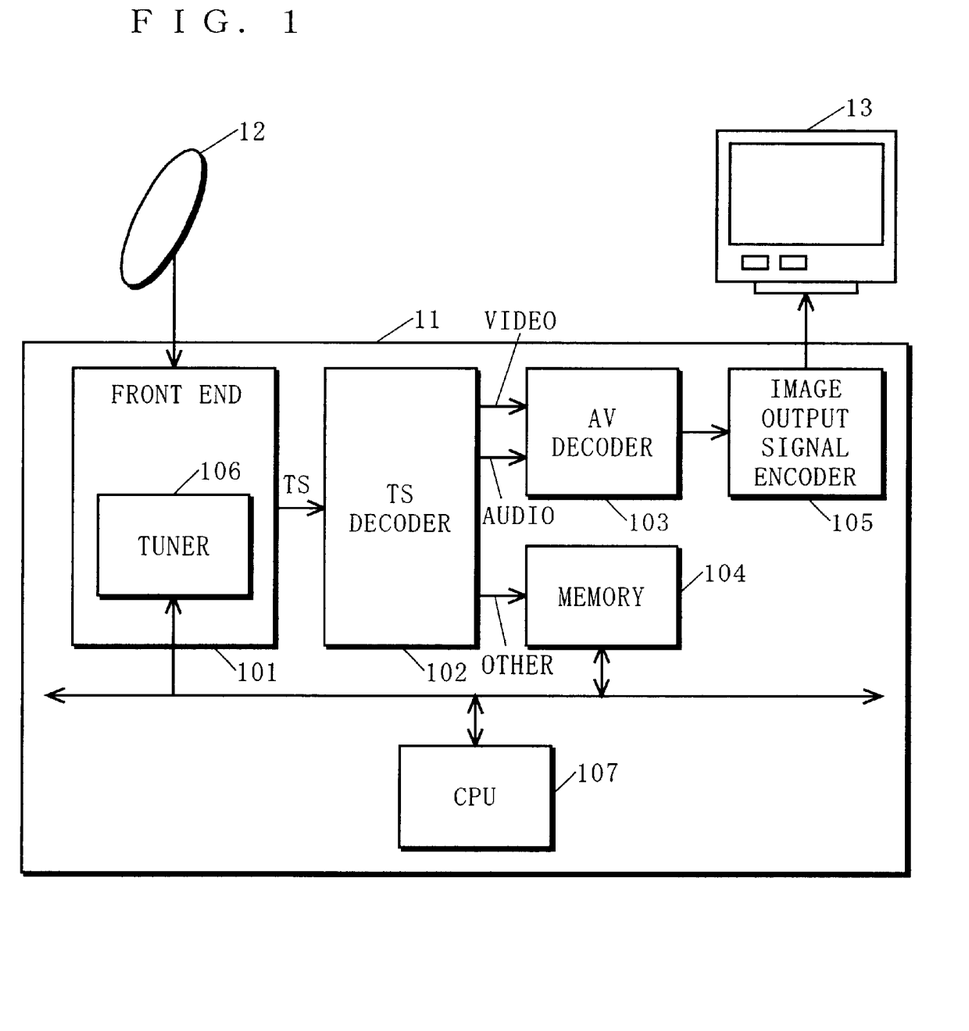
FIG. 1 is a diagram illustrating the structure of a digital broadcast receiving apparatus according to an embodiment of the present invention.

FIG. 1 is a diagram illustrating the structure of a digital broadcast receiving apparatus (hereinafter simply referred to as a "broadcast receiving apparatus") according to an embodiment of the present invention. The broadcast receiving apparatus 11 shown in FIG. 1 is connected to an antenna 12 and a display 13. The general structure of the broadcast receiving apparatus 11 shown in FIG. 1 is similar to that of a conventional broadcast receiving apparatus. The broadcast receiving apparatus 11 comprises a front end 101, a TS decoder 102, an AV (audio/visual) decoder 103, a memory 104, and an image output signal encoder 105. Hereinafter, the broadcast receiving apparatus 11 will be described in detail.

The front end 101 performs tuning and demodulation for a broadcast signal which is received at the antenna 12, and outputs an MPEG2 transport stream (denoted as "TS" in FIG. 1). The front end 101 includes a tuner 106 which is responsible for tuning. The TS decoder 102 demultiplexes the MPEG2 transport stream outputted from the front end 101, and outputs video, audio, and other information (information other than video or audio information). Such information is outputted in units such as PBS (Packetized Elementary Stream) packets or sections. In general, information such as video and audio, etc., is outputted in PBS packets, whereas applications which operate on a broadcast receiving apparatus are outputted in sections. The AV decoder 103 decodes video and audio information ("VIDEO" and "AUDIO" shown in FIG. 1), and outputs AV data. The image output signal encoder 105 converts AV data outputted from the AV decoder 103 into signals for image output. In other words, the image output signal encoder 105 subjects the AV data outputted from the AV decoder 103 to D/A conversion so as to output video/audio signals to be supplied to the display 13. The TS decoder 102 also outputs information other than video and audio information (denoted as "OTHER" in FIG. 1), which is retained in the memory 104 for use in various processes. For example, in the case of a system in which it is possible to download an application which operates on a broadcast receiving apparatus via a broadcast signal, e.g., a broadcast receiving apparatus conforming to the DVB-MHP standard, the downloaded application may be laid out on the memory 104, so as to be executed by the CPU 107. The CPU 107, which is a module in charge of computations, is coupled to the memory 104 and the tuner 106. The CPU 107 performs a tuning management process by executing a tuning management process program described in below. The details of the tuning management process will be described later. The CPU 107 is responsible for the execution of the aforementioned application and the like.

The broadcast receiving apparatus according to the present invention is applicable not only to a STB (Set Top Box) as show in FIG. 1 but also to a television receiver itself, for example. In other words, the present invention is not limited to an implementation in the form of an STB, but may also be realized as a component part of a television receiver. The present invention is applicable to any apparatus which receives a tuning request from an application or an input device and performs a tuning process based on the received tuning request. Furthermore, even in the case of an STB implementation, the present invention is not limited to the structure shown in FIG. 1. For example, the image output signal encoder 105, which outputs signals converted to a signal format such as NTSC (National Television System Committee), PAL (Phase Alternation by Line), or SECAM (SEquential Couleur A Memoire), etc., may employ any other signal format that is compatible with the display 13.

Figure 2:
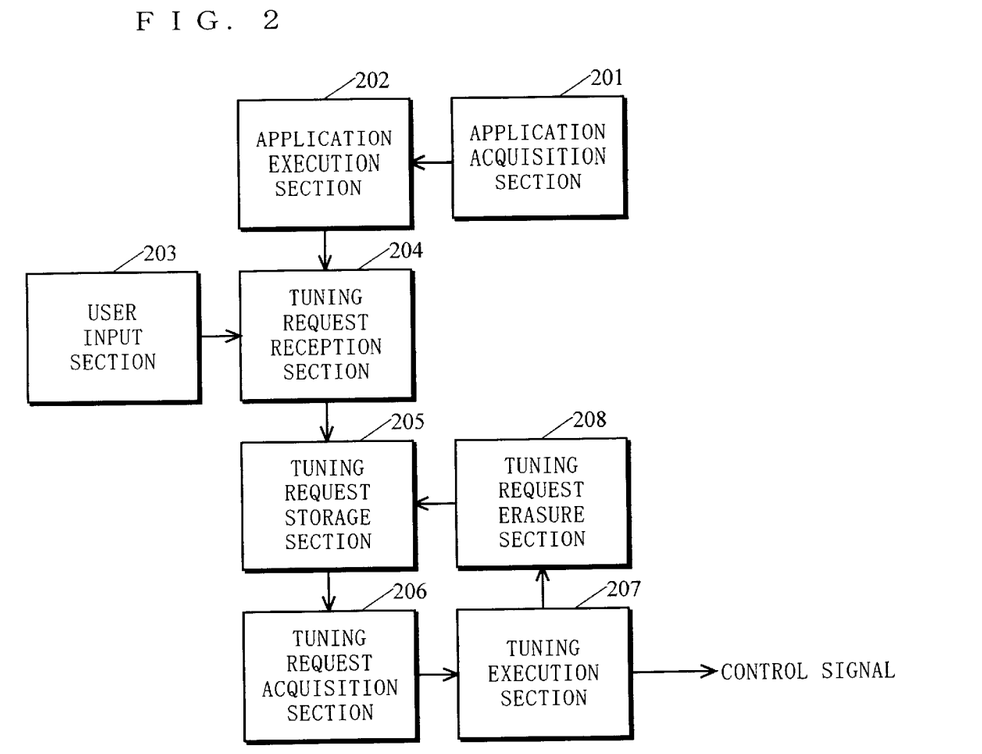
FIG. 2 is a functional block diagram illustrating the structure of the broadcast receiving apparatus according to an embodiment of the present invention.

FIG. 2 is a functional block diagram illustrating the structure of the broadcast receiving apparatus 11 according to the present embodiment. As shown in FIG. 2, the broadcast receiving apparatus 11 comprises an application acquisition section 201, an application execution section 202, a user input section 203, a tuning request reception section 204, a tuning request storage section 205, a tuning request acquisition section 206, a tuning execution section 207, and a tuning request erasure section 208.

The application acquisition section 201 acquires an application to be run on the broadcast receiving apparatus 11. The application acquisition section 201 may acquire an application via broadcast, or via a recording medium such as a CD or a DVD. In the case where an application is acquired via broadcast, the application acquisition section 201 can be realized by hardware necessary for acquiring an application from a broadcast signal, such as a front end 101 including a tuner 106, a TS decoder 102 and memories 104, etc., and controlling software therefor. In the case where an application is acquired from a recording medium such as a CD or a DVD, the application acquisition section 201 can be realized by hardware necessary for acquiring an application from a broadcast signal, such as a drive for use with the recording medium and memories, etc., and controlling software therefor. The application acquired by the application acquisition section 201 is outputted to the application execution section 202.

The application execution section 202 executes the application which is outputted from the application acquisition section 201. The application execution section 202 can be realized by the CPU 107 and the memory 104, etc., for executing the application. In the case where the application is described in an intermediate language such as Java byte code, software for interpreting and executing the intermediate language is required; in the case where the application is described in a native code compatible with the CPU 107, such software is unnecessary. When a tuning request is issued during the execution of the application, the application execution section 202 outputs the tuning request to the tuning request reception section 204. Specifically, the application execution section 202 issues a tuning request by calling a tuning API which is provided by a tuning management process program.

The user input section 203 outputs a tuning request issued by a user to the tuning request reception section 204. The user input section 203 can be realized by an input device, such as a button on a remote control or a touch panel, etc. Thus, a user utilizes the user input section 203 to issue a tuning request to the broadcast receiving apparatus 11.

The tuning request reception section 204 receives tuning requests from the user input section 203 and the application execution section 202. Specifically, as for tuning requests issued by a user, the tuning request reception section 204 receives a signal received by hardware such as a button or a touch panel as a tuning request. As for tuning requests issued by an application, tuning request reception section 204 interprets a call for a tuning API as a tuning request. Note that the tuning request reception section 204 is capable of receiving tuning requests regardless of whether a tuning process is being performed or not.

The tuning request storage section 205 stores a tuning request which has been received by the tuning request reception section 204. The tuning request storage section 205 can be realized by the memory 104. Alternatively, the tuning request storage section 205 may be realized by a dedicated register in the CPU 104. The tuning request storage section 205 is capable of storing a predetermined number of tuning requests. The tuning request storage section 205 stores the tuning requests together with ordinal information based on a chronological order. Hereinafter, specific examples of the tuning request storage section 205 will be described with reference to FIG. 3.

Figure 3:
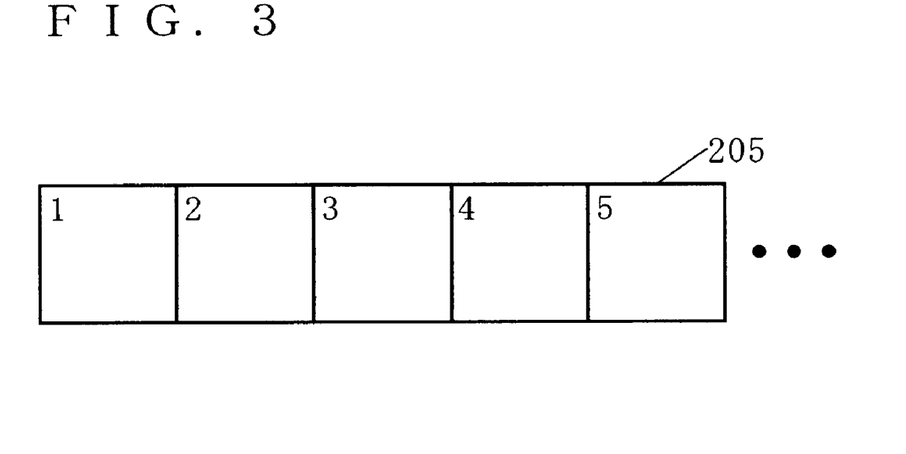
FIG. 3 is a diagram illustrating the case where no tuning requests are stored in a tuning request storage section 205 shown in FIG. 2.
Figure 4:
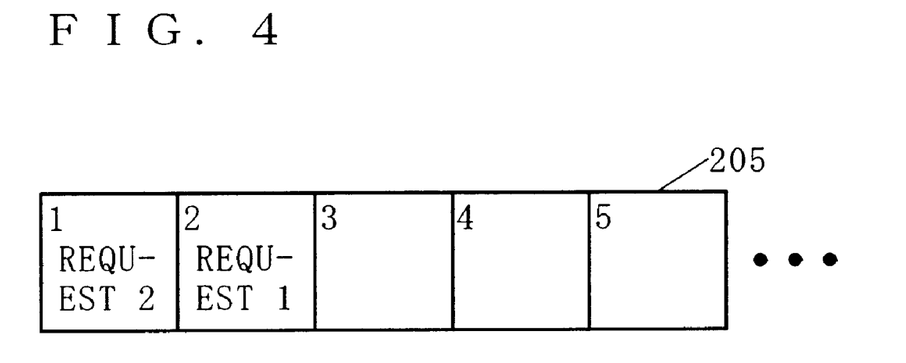
FIG. 4 is a diagram illustrating the case where two tuning requests are stored in the tuning request storage section 205 shown in FIG. 2.
Figure 5:
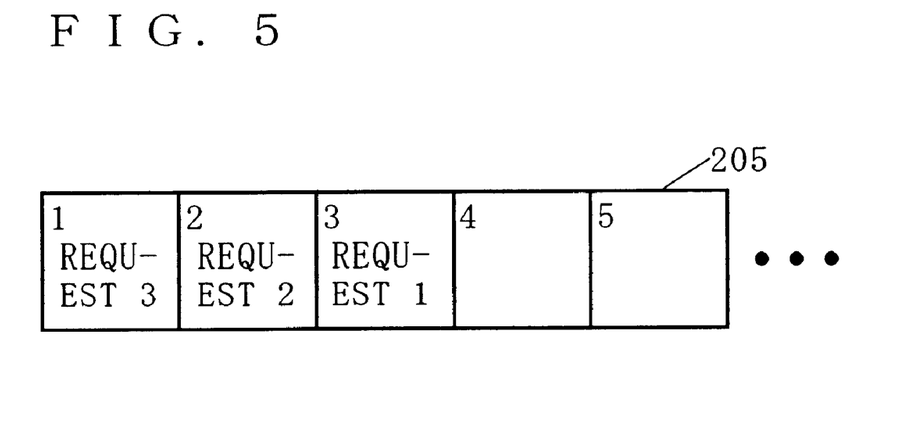
FIG. 5 is a diagram illustrating the case where three tuning requests are stored in the tuning request storage section 205 shown in FIG. 2.

FIGS. 3 to 5 are diagrams illustrating specific examples of the tuning request storage section 205 shown in FIG. 2. FIG. 3 illustrates the case where no tuning requests are stored in the tuning request storage section 205. FIG. 4 illustrates the case where two tuning requests (Requests 1 and 2) are stored in the tuning request storage section 205. FIG. 5 illustrates the case where three tuning requests (Requests 1 to 3) are stored in the tuning request storage section 205. In FIGS. 3 to 5, the number indicated in the upper left corner of each of the grids representing the tuning request storage section 205 represents ordinal information. As used herein, the "ordinal information" represents an order in which turning requests are stored in the tuning request storage section 205. For example, in FIG. 4, the tuning request (Request 2) in the grid bearing the ordinal information "1" is the tuning request which was stored last among all of the tuning requests in the tuning request storage section 205.

In the case where a further tuning request is added to the tuning request storage section 205, the ordinal information "1" is assigned to the further tuning request. Consequently, each of the ordinal information for the already-stored tuning requests is incremented by one. For example, if a tuning request "Request 3" is further issued from FIG. 4, the tuning request storage section 205 will take a state shown in FIG. 5. Although the tuning request storage section 205 is illustrated as having an array structure in FIGS. 3 to 5, any other data structure that is capable of ordinal information based on a chronological order together with tuning requests may be used.

In the present embodiment, it is assumed that the tuning request storage section 205 has a FIFO data structure and is capable of storing a predetermined number of tuning requests. Therefore, if any newly issued tuning request results in the predetermined number being exceeded by the number of tuning requests to be stored, the tuning request storage section 205 erases the oldest tuning request among the stored tuning requests, and instead stores the new tuning request.

Referring back to FIG. 2, the tuning request acquisition section 206 and the tuning execution section 207 will be described. As described below, the tuning request acquisition section 206 and the tuning execution section 207 perform a tuning process for a broadcast signal in accordance with a tuning request, and if a tuning request is issued during a tuning process, performs a next tuning process in accordance with one of the tuning requests stored in the tuning request storage section 205.

The tuning request acquisition section 206 acquires a tuning request stored in the tuning request storage section 205. In the present embodiment, the tuning request acquisition section 206 acquires the tuning request which has been received last, based on the ordinal information, from among the tuning requests stored in the tuning request storage section 205. Specifically, the tuning request acquisition section 206 acquires the tuning request having the ordinal information "1". The tuning request acquired by the tuning request acquisition section 206 is outputted to the tuning execution section 207. In another embodiment, the tuning request acquisition section 206 may acquire any other tuning request selected from among the tuning requests stored in the tuning request storage section 205.

The tuning execution section 207 performs a tuning process for a broadcast signal in accordance with the tuning request acquired by the tuning request acquisition section 206. Specifically, the tuning execution section 207 outputs a control signal for controlling the tuner 106 based on the tuning request that has been inputted from the tuning request acquisition section 206.

The tuning request erasure section 208 erases some or all of the tuning requests stored in the tuning request storage section 205 at a predetermined point in time. The "predetermined point in time" may be, for example, at the beginning of a tuning process by the tuning execution section 207 or at the end of a tuning process by the tuning execution section 207. In other words, upon receiving notification of a beginning or end of a tuning process from the tuning execution section 207, the tuning request erasure section 208 erases the tuning request(s) stored in the tuning request storage section 205 in accordance with a predetermined criterion. The predetermined criterion and the predetermined point in time will be described later.

The present invention can be realized in the form of a program, and can be easily practiced on a separate computer system by transferring the program as recorded on a recording medium. The tuning request reception section 204, the tuning request acquisition section 206, the tuning execution section 207, and the tuning request erasure section 208 according to the present embodiment are realized as a tuning management process program is executed by the CPU 107. In another embodiment, these component elements can be realized by a specialized hardware circuit. Although the structure of FIG. 2 is implemented as a generic digital broadcast receiving apparatus, it can also be implemented as an analog broadcast receiving apparatus. In other words, the present invention is also applicable to an analog broadcast receiving apparatus.

Next, the tuning management process performed by the CPU 107 will be described in detail. The tuning management process can be divided into a process concerning reception of tuning requests and a process concerning execution of tuning. Hereinafter, the process concerning reception of tuning requests and the process concerning execution of tuning will be described in detail.

Figure 6:
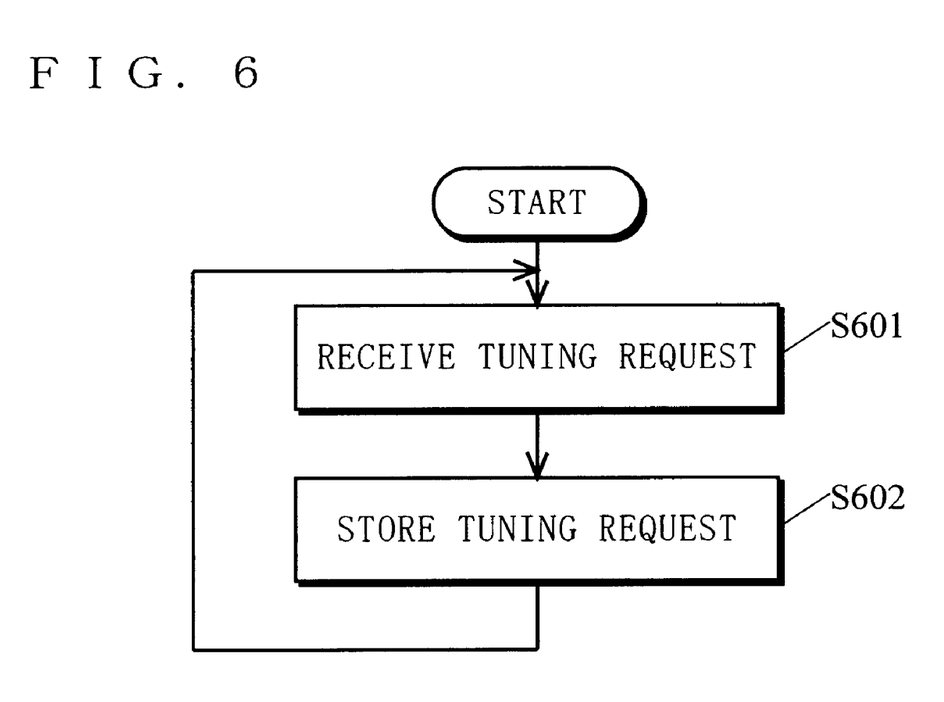
FIG. 6 is a flowchart illustrating a process concerning the reception of tuning requests according to an embodiment of the present invention.

FIG. 6 is a flowchart illustrating the process concerning reception of tuning requests according to the present embodiment. In the process concerning reception of tuning requests, the CPU 107 is in a state of waiting for tuning requests, and receives tuning requests as they are issue (step S601). As described above, tuning requests may be issued by an application or by a user. The process of step S601 realizes the tuning request reception section 204. Next, the CPU 107 stores the tuning request received at step S601 in the memory 104 (step S602). After step S602, the CPU 107 returns to the state of waiting for tuning requests. The CPU 107 performs processes of steps S601 and S602 every time a tuning request is issued. Steps S601 and S602 are performed in a period of time which is sufficiently shorter than that required for a tuning process to occur.

Figure 7:
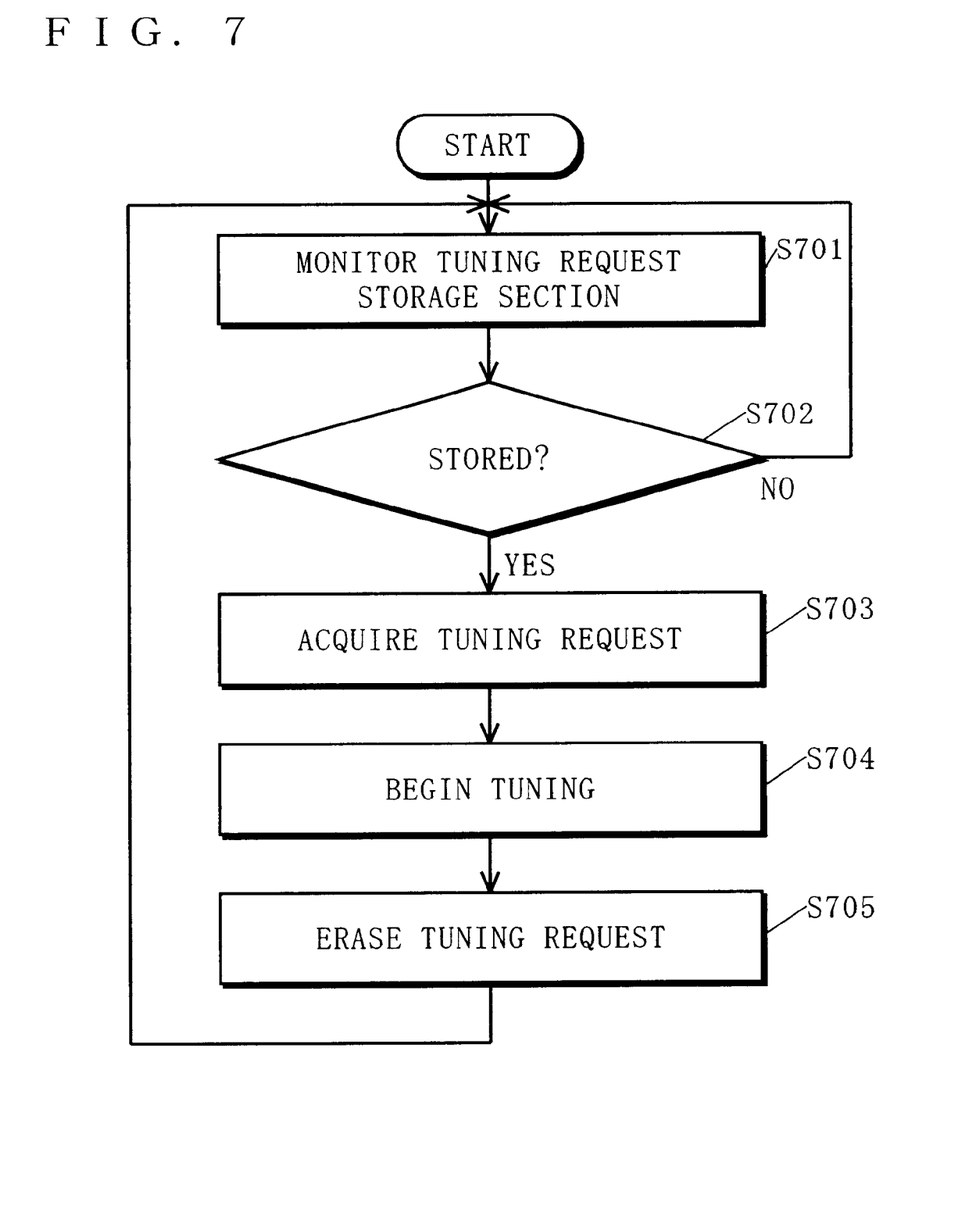
FIG. 7 is a flowchart illustrating a process concerning the execution of tuning according to an embodiment of the present invention.

FIG. 7 is a flowchart illustrating the process concerning the execution of tuning according to an embodiment of the present invention. In the process concerning the execution of tuning, the CPU 107 first monitors the memory 104 (step S701) to determine whether or not any tuning requests are stored therein (step S702). If no tuning request is stored, the CPU 107 returns to the process of step S701. On the other hand, if any tuning requests are stored, the CPU 107 acquires one of the tuning requests stored in the memory 104 (step S703). Step S703 realizes the tuning request acquisition section 206. In the present embodiment, the CPU 107 acquires the most recent one of the tuning requests stored in the memory 104. Specifically, the CPU 107 acquires a tuning request whose "ordinal information" is 1.

After step S703, the CPU 107 begins a tuning process in accordance with the acquired tuning request (step S704). Step S704 realizes the tuning execution section 207. Furthermore, the CPU 107 erases the tuning request(s) stored in the memory 104 (step S705). Step S705 realizes the tuning request erasure section 208. The process of step S705 is performed immediately after step S704. In other words, according to the present embodiment, the predetermined point in time at which a tuning request is erased is the beginning of a tuning process. The process of step S705 is performed before the tuning process begun at step S704 ends. After the tuning process begun at step S704 ends, the CPU 107 returns to step S701 and repeats the processes from steps S701 to S705.

The above-described process concerning reception of tuning requests and process concerning the execution of tuning are performed independently of each other. The time required for receiving a tuning request (i.e., the time required for steps S601 and S602) is sufficiently shorter than the time required for performing a tuning process (i.e., the time required for steps S701 to S705). Therefore, in the process concerning reception of tuning requests, the tuning requests issued during a tuning process are stored in the memory 104 as they occur.

Figure 8:
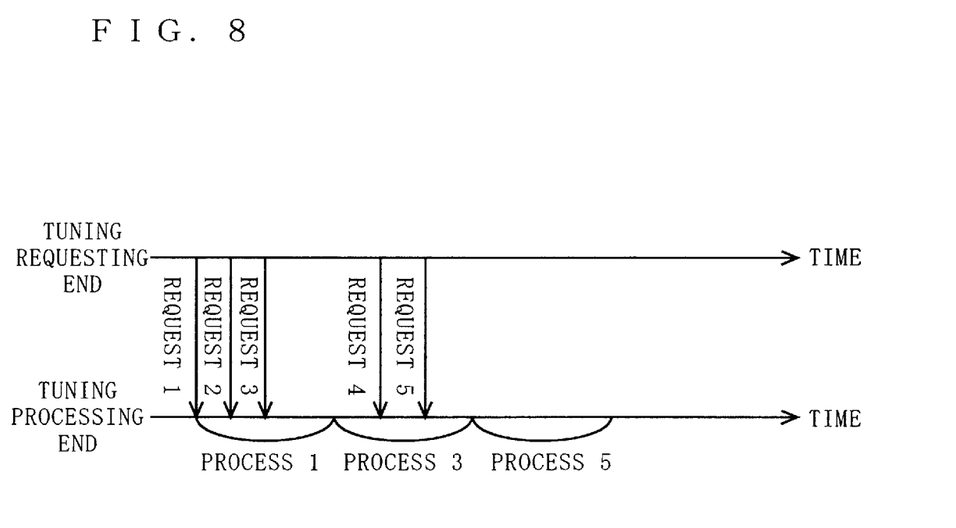
FIG. 8 is a diagram illustrating a timing scheme with which tuning requests are received and tuning processes are performed in the broadcast receiving apparatus according to an embodiment of the present invention.

Next, referring to FIG. 8, a specific example of the operation of the broadcast receiving apparatus 11 will be described. FIG. 8 is a diagram illustrating a timing scheme with which tuning requests are received and tuning processes are performed in the broadcast receiving apparatus 11. First, in FIG. 8, Tuning Request 1 (shown as Request 1 in FIG. 8) is issued from a tuning requesting end to a tuning processing end. As used herein, the "tuning requesting end" refers to an application which issues tuning requests and an input device used by a user to input tuning requests. The "tuning processing end" refers to a means responsible for the tuning of a broadcast signal employing the tuner 106. In the present embodiment, the tuning processing end corresponds to the CPU 107 executing a tuning management process program for realizing the aforementioned tuning management process.

In response to Tuning Request 1 shown in FIG. 8, the tuning processing end performs Tuning Process 1.

Figure 9:
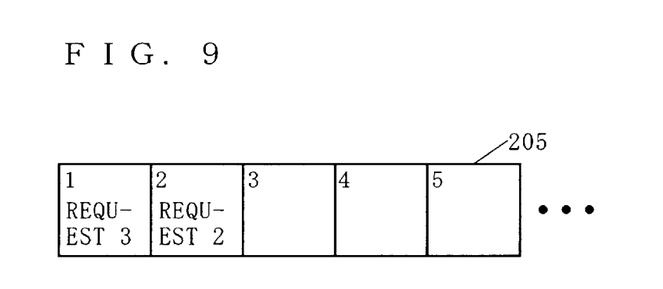
FIG. 9 is a diagram illustrating exemplary tuning requests stored in the tuning request storage section 205 shown in FIG. 2.

Specifically, the CPU 107 receives Tuning Request 1 (step S601), and stores Tuning Request 1 in the memory 104 (step S602). Furthermore, the CPU 107 performs the processes of steps S701 to S704 to begin the execution of tuning. Immediately after beginning the execution of tuning, Tuning Request 1 is erased (step S705). In FIG. 2, it is assumed that Tuning Requests 2 and 3 (shown as Requests 2 and 3 in FIG. 8) are issued during the processing of Tuning Process 1. In this case, the CPU 107 receives Tuning Request 2 during the tuning process (step S601), and stores Tuning Request 2 in the memory 104 (step S602). Furthermore, the CPU 107 performs a similar process for Tuning Request 3 to that performed for Tuning Request 2 (steps S601 and S602), so that the memory 104 (tuning request storage section 205) takes a state as shown in FIG. 9.

After Tuning Process 1 is ended, the CPU 107 monitors the memory 104 (step S701) to determine whether or not any tuning requests are stored therein (step S702). Then, the CPU 107 acquires a tuning request (Tuning Request 3) whose ordinal information is "1" (step S703), and executes tuning (step S704). Thus, Tuning Process 3 (corresponding to Tuning Request 3) is performed next to Tuning Process 1. Furthermore, once Tuning Process 3 is begun, the CPU 107 erases the tuning requests (Tuning Requests 2 and 3) stored in the memory 104.

Figure 10:
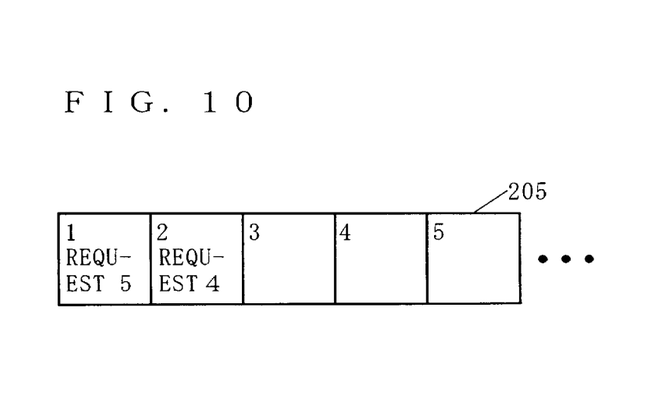
FIG. 10 is a diagram illustrating exemplary tuning requests stored in the tuning request storage section 205 shown in FIG. 2.

During the processing of Tuning Process 3, Tuning Requests 4 and 5 (shown as Requests 4 and 5 in FIG. 8) maybe issued. Tuning Requests 4 and 5 are stored in the memory 104 as in the manners of Tuning Requests 2 and 3. As a result, the memory 104 (tuning request storage section 205) takes a state as shown in FIG. 10. Thus, Tuning Process 5 is performed next to Tuning Process 3.

As described above, according to the present embodiment, even if any number of tuning requests are issued during a tuning process, only a tuning process which corresponds to one of the issued tuning requests is performed next, whereas the other issued tuning requests are ignored (i.e., no tuning processes corresponding thereto are performed). On the other hand, in accordance with the conventional broadcast receiving apparatus shown in FIG. 12, if a plurality of tuning requests are issued during a tuning process, tuning processes corresponding to all such tuning requests are performed. Note that Tuning Process 2 shown in FIG. 12 is considered as a tuning process which does not need to be performed because, after the corresponding tuning process is ended, a next tuning process (Tuning Process 3) is consecutively performed. In other words, in the case where two or more tuning processes are consecutively performed for tuning requests which are issued during a tuning process, the tuning processes except for the last one do not need to be performed. In contrast, according to the present embodiment of the invention, only one tuning process is performed for any number of tuning requests issued during a tuning process, thereby eliminating unnecessary tuning processes. Thus, the amount of time required for tuning processes can be reduced. Yet, since one tuning process is performed in response to the tuning requests issued during a tuning process, not all of the tuning requests issued during a tuning process are wasted.

Thus, the broadcast receiving apparatus 11 according to the present embodiment can efficiently perform tuning in response to consecutively issued tuning requests. If a tuning request is issued while the tuning execution section 207 is not performing a tuning process, the tuning request acquisition section 206 monitoring the tuning request storage section 205 acquires such a tuning request as soon as the received tuning request is retained in the tuning request storage section 205, and a corresponding tuning process is performed.

According to the present embodiment, the predetermined point in time for erasing a tuning request is the beginning of a tuning process. Thus, the maximum number of tuning requests storable in the tuning request storage section 205 can be set equal to the number of tuning requests which may potentially be issued during a period of time required for one tuning process to be performed. As a result, the amount of memory provided in the tuning request storage section 205 can be reduced.

Although the present embodiment illustrates an example where the erasure of a tuning request(s) occurs immediately after the beginning of a tuning process, the erasure of a tuning request(s) may occur at the end of a tuning process in another embodiment. In other words, the process of step S705 in FIG. 7 may be performed after the tuning process begun at step S704 ends. In this case, at step S705 in FIG. 7, the CPU 107 erases the tuning request corresponding to the tuning process performed at the preceding step S704 as well as any previous tuning requests in the memory 104. Specifically, the CPU 107 erases tuning requests whose ordinal information has a value greater than that of the tuning request acquired at the preceding step S703.

In the case where the predetermined criterion to be used in the acquisition process of a tuning request dictates that the most recent tuning request be acquired, the erasure of tuning requests older than the acquired tuning request may occur at any point after the most recent tuning request has been acquired.

In the above-described embodiment, the process of acquiring a tuning request (step S703, step S706) only occurs while a tuning process (step S704) is not performed. Alternatively, for faster operation, it is possible to previously acquire a next tuning request during a tuning process, in the fashion of pipeline processing.

Moreover, the tuning request storage section 205 may be arranged so as to store only one tuning request in the present embodiment. As a result, the amount of memory provided in the tuning request storage section 205 can be minimized. In this case, if a new tuning request is received by the tuning request reception section 204, the tuning request storage section 205 updates the already-stored tuning request to the newly-received tuning request.

Hereinafter, variant operations of the present embodiment will be described. First, an operation which accounts for failed tuning processes will be described. Note that, in the above-described operation, a tuning request(s) retained in the tuning request storage section 205 is erased at the beginning of a tuning process (see step S705). Therefore, a tuning request will be destroyed even if its corresponding tuning process fails. In contrast, the below operation makes it possible to again perform a tuning process when a tuning process fails.

Figure 11:
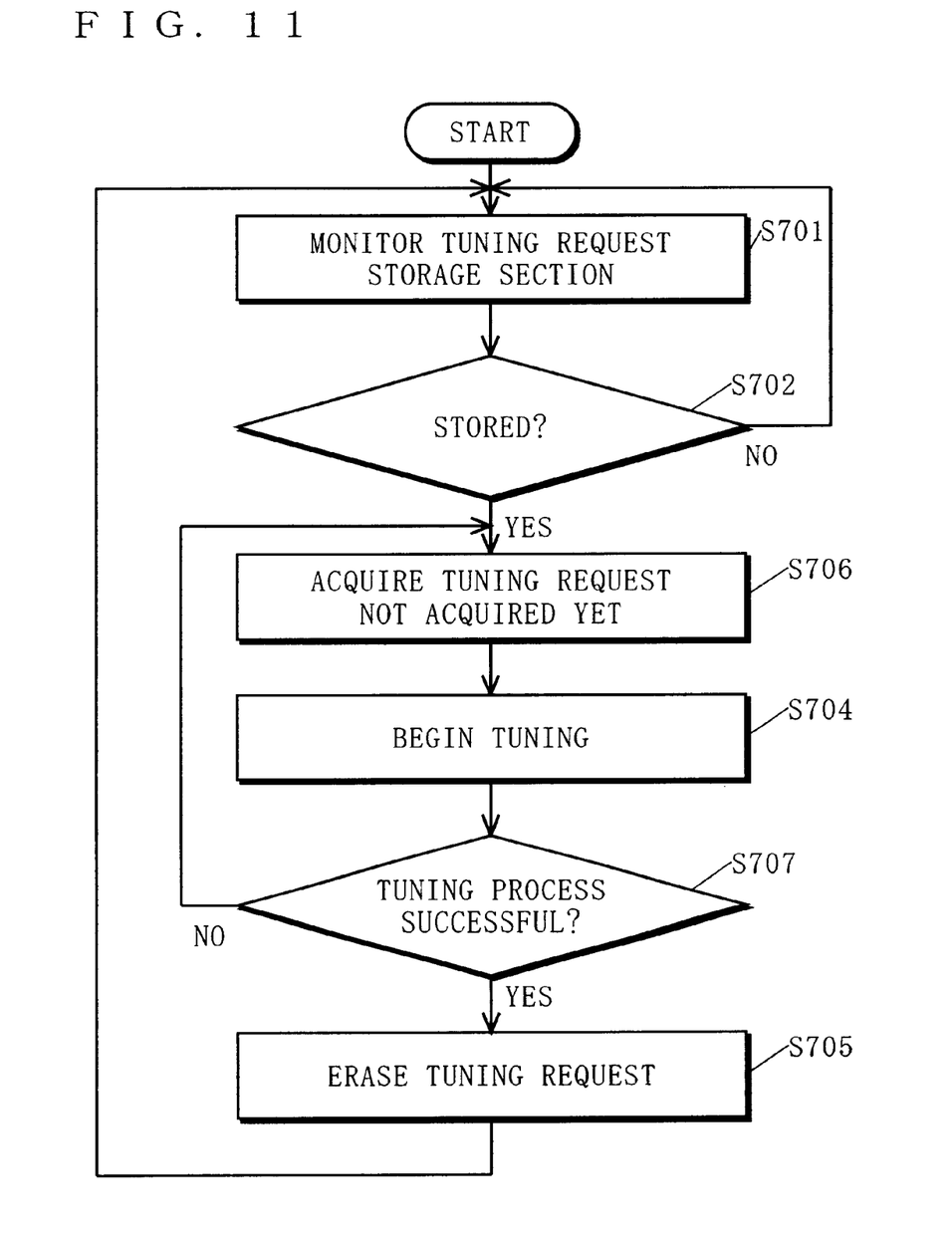
FIG. 11 is a flowchart a variant operation of the process concerning the execution of tuning shown in FIG. 7.

FIG. 11 is a flowchart of a variant operation of the process concerning the execution of tuning shown in FIG. 7. Since the only differences between FIG. 11 and FIG. 7 are steps S706 and S707, these steps will be specifically described, while the other steps will be omitted from the description below.

In FIG. 11, if step S702 finds that a tuning request is stored, then the CPU 107 acquires the most recent tuning request among the tuning requests stored in the memory 104 that have not been acquired yet (step S706). The process of step S704 is similar to that shown in FIG. 7. After step S704, the CPU 107 determines whether or not the tuning process performed at step S704 was successful or not (step S707). If the tuning process was successful, the CPU 107 performs the process of step S705. The process of step S705 is similar to that shown in FIG. 7 except that it is performed after the completion of the tuning process. On the other hand, if a tuning process fails, the CPU 107 returns to the process of step S706.

Thus, in FIG. 11, if a tuning process fails, a tuning process is performed with respect to the most recent tuning request among the tuning requests stored in the memory 104 that have not been acquired yet. As a result, if a tuning process based on a most recent tuning request fails, a tuning process for another tuning request can be performed. Note that the tuning request to be acquired at step S706 may be any tuning request that has not been acquired yet, instead of the most recent one.

Next, an adaptation in the case where a result of a tuning process for each tuning request is to be returned will be described. The DVB-MHP standard stipulates that, for any tuning request issued from an application, the result of a corresponding tuning process be notified back to the application. When the broadcast receiving apparatus according to the present embodiment is to be utilized under such an environment, it is also necessary to notify the result of a tuning process corresponding to an erased tuning request. Therefore, before the erasure of any tuning requests, the CPU 107 needs to acquire the number of tuning requests to be erased and the application which is expecting a notification. The number of tuning requests to be erased can be acquired before step S705 is performed to erase a tuning request(s). The application which is expecting a notification can be acquired by storing information indicating where the tuning request has been issued from together with each tuning request in the tuning request storage section 205. The notification may be made immediately before the erasure of a tuning request(s) or after the erasure. In the above case, the process concerning reception of tuning requests stored in the tuning request storage section 205 is similar to that in the above-described embodiment. Therefor, the operation of the present embodiment is applicable to the case where additional information (such as information indicating where a tuning request has been issued from) is employed.

Next, the numbers of users and applications will be discussed. The above-described embodiment assumes an environment in which tuning requests are issued from a single user (user input section 203) and a single application (application execution section 202). However, the operation according to the present embodiment may be performed under other environments as well. Three kinds of environments are possible: an environment in which only a user issues tuning requests; an environment in which only an application issues tuning requests; and an environment in which both a user and an application issue tuning requests. Furthermore, depending on whether there is a single user or plural users, and whether there is a single application or plural applications, eight kinds of environments are contemplated.

In the present embodiment, the tuning requests which are issued by a user(s) and an application(s) are abstracted by the tuning request reception section 204 so as to be regarded as being of the same format. Therefore, the operation according to the present embodiment can well be applied to the eight contemplated environments mentioned above. In each case, it is possible to identify where a tuning request has been issued from among a plurality of applications, and notify the result of a tuning process back to that application, by employing information indicating where a tuning request has been issued from.

Next, a case in which the broadcast receiving apparatus includes a plurality of tuners 106 will be described. In this case, the tuning execution section 207 can individually perform a tuning process with respect to each of the plurality of tuners. In the case where it is unnecessary to distinguish between the plurality of tuners, such that a given tuning process may non-discriminatorily be performed by any one of the tuners, the tuning request acquisition section 206 may acquire a tuning request on the condition that at least one of the tuners is not performing a tuning process. Furthermore, the tuning execution section 207 performs a tuning process by using a vacant (i.e., not performing a tuning process) tuner, based on the tuning request acquired by the tuning request acquisition section 206. On the other hand, in the case where it is necessary to distinguish between the plurality of tuners, e.g., the tuners are receiving respectively different broadcast signals or if the tuners have different functions, it is necessary to store information for identifying tuners as additional information, at the time of storing tuning requests in the tuning request storage section 205. In this case, the tuning request acquisition section 206 acquires a tuning request directed to a tuner which is not performing a tuning process. Furthermore, the tuning execution section 207 performs a tuning process using the tuner based on the tuning request acquired by the tuning request acquisition section 206.

While the invention has been described in detail, the foregoing description is in all aspects illustrative and not restrictive. It is understood that numerous other modifications and variations can be devised without departing from the scope of the invention.

What is claimed is:

1. A broadcast receiving apparatus for receiving a broadcast signal, comprising:
   a tuning request reception section for receiving an issued tuning request;
   a tuning request storage section for storing the tuning request received by the tuning request reception section;
   a tuning process section for performing a tuning process for the broadcast signal corresponding to the tuning request, wherein, if at least one tuning request is issued during the tuning process, the tuning process section performs a next tuning process corresponding to one of the at least one tuning request stored in the tuning request storage section during the tuning process; and
   a tuning request erasure section for erasing, at a predetermined point in time, the at least one tuning request stored in the tuning request storage section during the tuning process.

2. The broadcast receiving apparatus according to claim 1, wherein the tuning request erasure section erases the at least one tuning request stored in the tuning request storage section at the beginning of the tuning process.

3. The broadcast receiving apparatus according to claim 1, wherein
   the tuning request storage section is capable of storing a predetermined number of tuning requests, and
   if the predetermined number is exceeded as a result of a new tuning request issued during the tuning process, the new tuning request replaces one of the tuning requests already stored.

4. The broadcast receiving apparatus according to claim 1, wherein
   if the tuning process fails, the tuning process section performs a further tuning process corresponding to one of the tuning requests stored in the tuning request storage section during a previous tuning process, and the tuning request erasure section erases the at least one tuning request stored in the tuning request storage section during the previous tuning process after the further tuning is completed.

5. The broadcast receiving apparatus according to claim 4, wherein the tuning request storage section is capable of storing a predetermined number of tuning requests, and if the predetermined number is exceeded as a result of a new tuning request issued during the tuning process, the new tuning request replaces one of the tuning requests already stored.

6. The broadcast receiving apparatus according to claim 1, wherein, if at least one tuning request is issued during the tuning process, the tuning process section performs a next tuning process corresponding to a most recent tuning request among the at least one tuning request stored in the tuning request storage section.

7. The broadcast receiving apparatus according to claim 6, wherein the tuning request storage section is capable of storing one tuning request, and if a new tuning request is received by the tuning request reception section, the new tuning request replaces one of the tuning requests already stored.

8. The broadcast receiving apparatus according to claim 1, wherein the tuning requests are issued by a software application.

9. A tuning request management method for use in a broadcast receiving apparatus for receiving a broadcast signal, comprising:

a tuning request reception step of receiving an issued tuning request;

a tuning request storage step of storing the tuning request received in the tuning request reception step;

a tuning process step of performing a tuning process for the broadcast signal corresponding to the tuning request, wherein, if at least one tuning request is issued during the tuning process, a next tuning process is performed corresponding to one of the at least one tuning request stored in the tuning request storage step during the tuning process; and a tuning request erasure step of erasing, at a predetermined point in time, the at least one tuning request stored during the tuning process.

10. The tuning request management method according to claim 9, wherein, at the beginning of the tuning process, the tuning request erasure step erases the at least one tuning request stored in a previous tuning process.

11. The tuning request management method according to claim 9, wherein, if a predetermined number is exceeded as a result of a new tuning request issued during the tuning process, the new tuning request replaces one of the tuning requests already stored.

12. The tuning request management method according to claim 9, wherein if the tuning process fails, the tuning process step performs a further tuning process corresponding to one of the tuning requests stored during a previous tuning process, and the tuning request erasure step erases the at least one tuning request stored during the previous tuning process after the further tuning is completed.

13. The tuning request management method according to claim 12, wherein, if a predetermined number is exceeded as a result of a new tuning request issued during the tuning process, the new tuning request replaces one of the tuning requests already stored.

14. The tuning request management method according to claim 9, wherein, if at least one tuning request is issued during the tuning process, the tuning process step performs a next tuning process corresponding to a most recent tuning request among the at least one tuning request stored in the tuning request storage step.

15. The tuning request management method according to claim 14, wherein the tuning request storage step each stores one tuning request, and if a new tuning request is received by the tuning request reception step, the new tuning request replaces one of the tuning requests already stored.

16. The tuning request management method according to claim 9, wherein the tuning requests are issued by a software application.

17. A program for causing a computer comprised in a broadcast receiving apparatus for receiving a broadcast signal to execute:

a tuning request reception step of receiving an issued tuning request;

a tuning request storage step of storing the tuning request received in the tuning request reception step;

a tuning process step of performing a tuning process for the broadcast signal corresponding to the tuning request, wherein, if at least one tuning request is issued during the tuning process, a next tuning process is performed corresponding to one of the at least one tuning request stored in the tuning request storage step during the tuning process; and a tuning request erasure step of erasing, at a predetermined point in time, the at least one tuning request stored during the tuning process.

* * * * *